(12) United States Patent
Duce et al.

(10) Patent No.: US 8,704,102 B2
(45) Date of Patent: Apr. 22, 2014

(54) PRINTED FLEXIBLE MULTILAYER TWISTED-PAIR SHIELDED HIGH SPEED DATA CABLE

(75) Inventors: Jeffrey L. Duce, Milton, WA (US);
Joseph A. Marshall, Kent, WA (US)

(73) Assignee: The Boeing Company, Chicago, IL (US)

( * ) Notice: Subject to any disclaimer, the term of this patent is extended or adjusted under 35 U.S.C. 154(b) by 193 days.

(21) Appl. No.: 13/315,713

(22) Filed: Dec. 9, 2011

(65) Prior Publication Data
US 2013/0146338 A1 Jun. 13, 2013

(51) Int. Cl.
*H01K 3/10* (2006.01)
*H05K 1/09* (2006.01)

(52) U.S. Cl.
USPC .......................................... 174/254; 29/852

(58) Field of Classification Search
USPC ................... 174/254, 261–266; 29/852–853; 361/792–795
See application file for complete search history.

(56) References Cited

U.S. PATENT DOCUMENTS

| | | | |
|---|---|---|---|
| 5,036,160 A | 7/1991 | Jackson | |
| 5,357,051 A | 10/1994 | Hwang | |
| 5,646,368 A | 7/1997 | Muyshondt et al. | |
| 6,372,996 B2 * | 4/2002 | Lin et al. | 174/250 |
| 7,271,985 B1 | 9/2007 | Buhler et al. | |
| 2010/0163282 A1 | 7/2010 | Tagi et al. | |
| 2010/0307798 A1 * | 12/2010 | Izadian | 174/255 |
| 2011/0097579 A1 * | 4/2011 | Mizuno et al. | 428/355 R |

FOREIGN PATENT DOCUMENTS

| | | |
|---|---|---|
| DE | 10157678 | 6/2003 |
| GB | 2369727 A | 6/2002 |
| JP | 2004227891 | 8/2004 |

OTHER PUBLICATIONS

Combined Search and Examination Report, GB1221945.7, Mar. 25, 2013.

* cited by examiner

*Primary Examiner* — Jeremy Norris
(74) *Attorney, Agent, or Firm* — Ameh IP; Elahe Toosi; Lowell Campbell (57) ABSTRACT

A twisted-pair cable and methods are disclosed. The twisted-pair cable comprises a first layer comprising a first non-conductive. A second layer is coupled to the first layer, and comprises a printed circuit patterned with first diagonal conductor segments. A third layer is coupled to the second layer, and comprises a non-conductive strip. A fourth layer is coupled to the third layer, and comprises a printed circuit patterned with second diagonal conductor segments. The first diagonal conductor segments and the second diagonal conductor segments are coupled at respective segment ends such that at least two wires are formed around the non-conductive strip. A fifth layer is coupled to the fourth layer, and comprises a second non-conductive.

20 Claims, 11 Drawing Sheets

FIG. 4 LAYER 2

FIG. 3 FIRST SHIELDING LAYER + LAYER 1

PRINTED FLEXIBLE MULTILAYER TWISTED-PAIR SHIELDED HIGH SPEED DATA CABLE

FIELD

Embodiments of the present disclosure relate generally to wire cables. More particularly, embodiments of the present disclosure relate to custom wire cables.

BACKGROUND

As aircraft become more efficient, the need for higher levels of system integration increases. Standard aerospace wiring is heavy with much of the weight coming from brackets, wire ties, structural design changes to allow for wire routing, connectors, etc. Standard data transmission cables can be heavy and bulky and can contain many wires. These wires generally are pulled end to end in a fixture and each wire is connected by hand. This is a labor intensive process which can result in errors with wires being placed on a wrong pin of a connector. Also, these wire bundles generally require a large amount of additional hardware in a vehicle to route, hang, and secure the wires.

SUMMARY

A printed twisted-pair cable and methods are disclosed. The printed twisted-pair cable comprises a first layer comprising a first non-conductive layer. A second layer is coupled to the first layer, and comprises a printed circuit patterned with first diagonal conductor segments. A third layer is coupled to the second layer, and comprises a non-conductive strip. A fourth layer is coupled to the third layer, and comprises a printed circuit patterned with second diagonal conductor segments. The first diagonal conductor segments and the second diagonal conductor segments are coupled at respective segment ends such that at least two wires are formed around the non-conductive strip. A fifth layer is coupled to the fourth layer, and comprises a second non-conductive layer.

The method of creating the twisted-pair data cable can be automated and thus printed twisted-pair data transmission wires are generally not misplaced or misconnected. Further, since a "bundle" may be very thin, the "bundle" can be routed through a vehicle with little structural impact. In addition, printed materials such as inks tend to be more flexible and are generally not as fatigue prone as gauged copper wire. Printed twisted-pair data transmission wires according to embodiments of the disclosure open up a design space for wire integration. Furthermore, printed twisted-pair data transmission wires (printed twisted-pair cable) according to embodiments of the disclosure, are not susceptible to issues associated with traditional flex cables (e.g., cracking and fractured traces among others), and may have a longer fatigue life.

In an embodiment, a printed twisted-pair cable comprises a first layer, a second layer, a third layer, a fourth layer and a fifth layer. The first layer comprises a first non-conductive layer. The second layer is coupled to the first layer, and comprises a printed circuit patterned with a plurality of first diagonal conductor segments. The third layer is coupled to the second layer, and comprises a non-conductive strip. The fourth layer is coupled to the third layer, and comprises a printed circuit patterned with a plurality of second diagonal conductor segments. The first diagonal conductor segments and the second diagonal conductor segments are coupled at respective segment ends such that at least two wires are formed around the non-conductive strip. The fifth layer is coupled to the fourth layer, and comprises a second non-conductive layer.

In another embodiment, a method for providing a printed twisted-pair cable on a substrate provides a first layer comprising a first non-conductive layer. The method further couples a second layer comprising a printed circuit patterned with a plurality of first diagonal conductor segments to the first layer, and couples a third layer comprising a non-conductive strip to the second layer. The method further couples a fourth layer comprising a printed circuit patterned with a plurality of second diagonal conductor segments to the third layer. The method further couples the first diagonal conductor segments and the second diagonal conductor segments at respective segment ends such that at least two wires are formed around the non-conductive strip. The method further couples a fifth layer comprising a second non-conductive layer to the fourth layer.

In a further embodiment, a method of customizing a twisted-pair cable provides a cable configuration, and configures a first layer comprising a first non-conductive layer according to the cable configuration. The method further configures a second layer comprising a printed circuit patterned with a plurality of first diagonal conductor segments according to the cable configuration, and configures a third layer comprising a non-conductive strip to the cable configuration. The method further configures a fourth layer comprising a printed circuit patterned with a plurality of second diagonal conductor segments to the cable configuration, and configures a fifth layer comprising a second non-conductive layer according to the cable configuration. The method further couples the first diagonal conductor segments and the second diagonal conductor segments at respective segment ends such that at least two wires are formed around the non-conductive strip. The method further couples the first layer, the second layer, the third layer, the fourth layer, and the fifth layer to form the twisted-pair cable.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF DRAWINGS

A more complete understanding of embodiments of the present disclosure may be derived by referring to the detailed description and claims when considered in conjunction with the following figures, wherein like reference numbers refer to similar elements throughout the figures. The figures are provided to facilitate understanding of the disclosure without limiting the breadth, scope, scale, or applicability of the disclosure. The drawings are not necessarily made to scale.

DETAILED DESCRIPTION

The following detailed description is exemplary in nature and is not intended to limit the disclosure or the application and uses of the embodiments of the disclosure. Descriptions of specific devices, techniques, and applications are provided only as examples. Modifications to the examples described herein will be readily apparent to those of ordinary skill in the art, and the general principles defined herein may be applied to other examples and applications without departing from the spirit and scope of the disclosure. The present disclosure should be accorded scope consistent with the claims, and not limited to the examples described and shown herein.

Embodiments of the disclosure may be described herein in terms of functional and/or logical block components and various processing steps. It should be appreciated that such block components may be realized by any number of hardware, software, and/or firmware components configured to perform the specified functions. For the sake of brevity, conventional techniques and components related to, printed electronics, electrical systems, and other functional aspects of the systems (and the individual operating components of the systems) may not be described in detail herein. In addition, those skilled in the art will appreciate that embodiments of the present disclosure may be practiced in conjunction with a variety of circuits, and that the embodiments described herein are merely example embodiments of the disclosure.

Embodiments of the disclosure are described herein in the context of a practical non-limiting application, namely, a data transmission cable for operating an aircraft electrical system. Embodiments of the disclosure, however, are not limited to such aircraft electrical system applications, and the techniques described herein may also be utilized in other applications. For example but without limitation, embodiments may be applicable to power cables, coaxial cable, or other wire cable.

As would be apparent to one of ordinary skill in the art after reading this description, the following are examples and embodiments of the disclosure and are not limited to operating in accordance with these examples. Other embodiments may be utilized and structural changes may be made without departing from the scope of the exemplary embodiments of the present disclosure.

As mentioned above, as aircraft become more efficient, a need for higher levels of system integration increases. Standard aerospace wiring is heavy with much of the weight coming from brackets, wire ties, structural design changes to allow for wire routing, connectors, etc.

Data transmission cables can be heavy and bulky and can contain many wires. These wires are generally pulled end to end in a fixture and each wire is connected by hand. This is a labor intensive process which can result in errors with wires being placed on a wrong pin of a connector. Also, these wire bundles generally require a large amount of additionally hardware in a vehicle to route, hang, and secure the wires.

In contrast, according to the embodiments of the disclosure, a printed wires method of creating data cables can be automated and thus printed twisted-pair data transmission wires are much less likely to be misplaced or misconnected. Further, since a "bundle" may be very thin, the "bundle" can be routed through a vehicle with little structural impact. In addition, printed materials such as inks tend to be more flexible and are generally not as fatigue prone as gauged copper wire. Printed twisted-pair data transmission wires according to embodiments of the disclosure open up a design space for wire integration. Furthermore, printed twisted-pair data transmission wires according to embodiments of the disclosure, are not susceptible to issues associated with tradition flex cables such as cracking and fractured traces, and may have a longer fatigue life.

Figure 1:
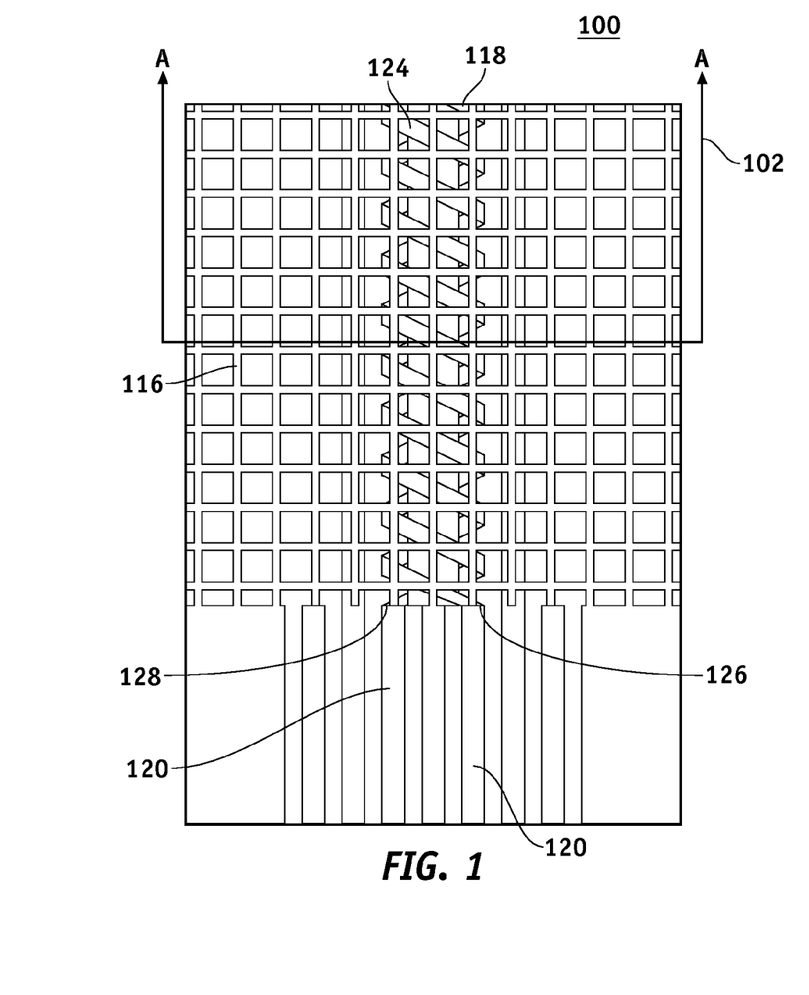
FIG. 1 is an illustration of a top view of an exemplary printed flexible multilayer twisted-pair shielded high speed data cable according to an embodiment of the disclosure.

FIG. 1 is an illustration of a top view of an exemplary printed flexible multilayer twisted-pair shielded high speed data cable 100 (twisted-pair cable 100) according to an embodiment of the disclosure. The twisted-pair cable 100 comprises shielding layers such as the shielding layer 116 of printed circuitry that can be patterned. The shielding layers may comprise a patterned conductive surface such as a frequency selective surface (FSS) having a geometry such that Radio Frequency (RF) energy is absorbed within a specific range thereon. In this manner, the shielding layers filter out incoming noise in a desired bandwidth thus minimizing an amount of metal needed for shielding. The twisted-pair cable 100 comprises twisted-pair data transmission wires 118 and 124 that are substantially flat and can be routed with substantial ease without a need for large holes. In this document twisted-pair cable 100 and printed twisted-pair cable 100 may be used interchangeably.

Figure 2:
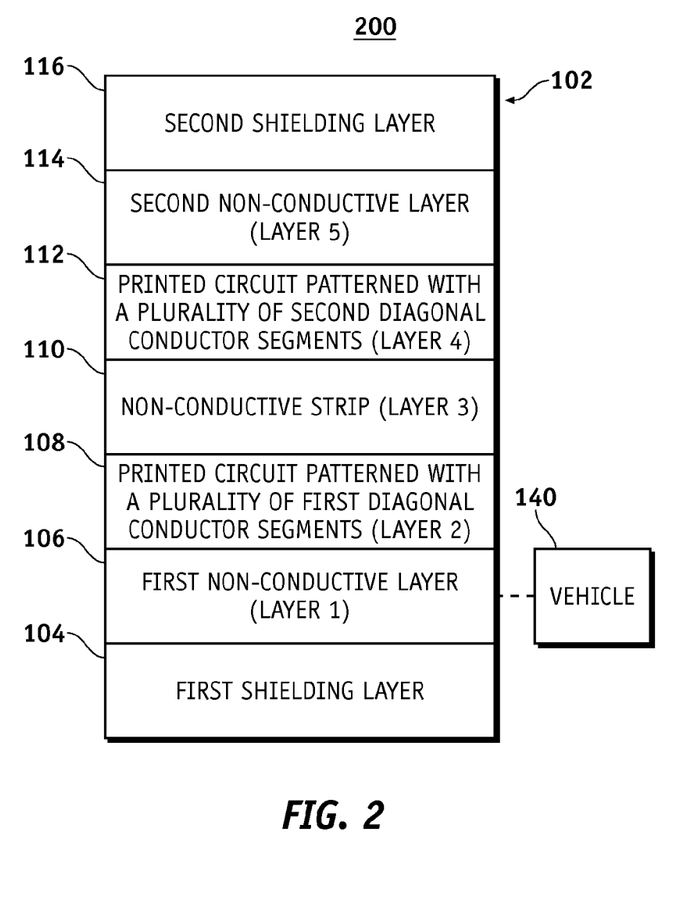
FIG. 2 is an illustration of an exemplary printed flexible multilayer twisted-pair shielded high speed data cable showing a cross section of multiple layers thereof taken along a line A-A of FIG. 1 according to an embodiment of the disclosure.

The twisted-pair data transmission wires 118 and 124 can be configured to not be connected incorrectly by comprising only a single way to be connected. The twisted-pair data transmission wires 118 and 124 are printed in multiple layers as shown in FIG. 2 at a cross section taken along a line A-A 102 of the twisted-pair cable 100, and patterned in a way that the data transmission wires 118 and 124 are 'twisted' around each other for shielding and crosstalk protection. The data transmission wires 118 and 124 are printed onto a first non-conductive layer 106 (FIG. 2) such as a flat polymeric film.

A connector 120 is coupled to a wire end 126 and a wire end 128 of each of the data transmission wires 118 and 124 respectively. Outer most shielding layers such as the first shielding layer 104 (FIG. 2) and the second shielding layer 116 are patterned in a way to absorb incoming Radio Frequency (RF) noise. A layer of pressure sensitive adhesive (not shown) can be placed on the first non-conductive layer 106 in order to bond the twisted-pair cable 100 onto a surrounding structure such as a vehicle 140 (FIG. 2). In this manner, the twisted-pair cable 100 can be installed on the vehicle 140 and power electronic systems of the vehicle 140 therethrough and/or provide for signal/data transmission.

FIG. 2 is an illustration of a cross section 200 of the exemplary printed flexible multilayer twisted-pair shielded high speed data cable 100 thereof taken along the line A-A 102 of FIG. 1 according to an embodiment of the disclosure. FIG. 2 is discussed below in conjunction with FIGS. 3-7.

The cross section 200 comprises multiple layers such as a first shielding layer 104, a first non-conductive layer 106 (first layer 106 or layer 1), a second layer 108 (layer 2) comprising a printed circuit patterned with a plurality of first diagonal conductor segments 130 (FIG. 4), a non-conductive strip 110 (third layer 110 or layer 3), a fourth layer 112 (layer 4) comprising a printed circuit patterned with a plurality of second diagonal conductor segments 132 (FIG. 7), a second non-conductive layer 114 (fifth layer 114 or layer 5), and a second shielding layer 116.

The first shielding layer 104 may be patterned in a way to absorb incoming RF noise. The first shielding layer 104 may comprise, for example but without limitation, a faraday cage, a patterned metal, or other electromagnetic shield.

Figure 3:
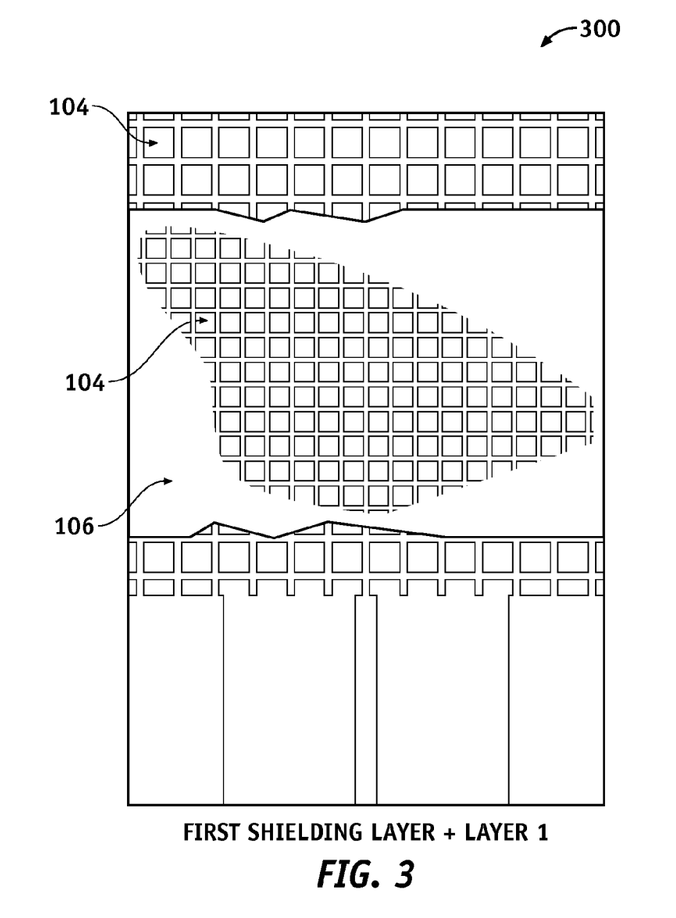
FIGS. 3-5 are illustrations of top views of a first shielding layer and a first layer, a second layer, and a third layer respectively of an exemplary printed flexible multilayer twisted-pair shielded high speed data cable according to an embodiment of the disclosure.

The first non-conductive layer 106 (substrate 106) may be coupled to the first shielding layer 104 as is further shown in FIG. 3. The first non-conductive layer 106 may comprise, for example but without limitation, rubber, plastic, or other non-conductive material, to form a flexible substrate.

Figure 4:
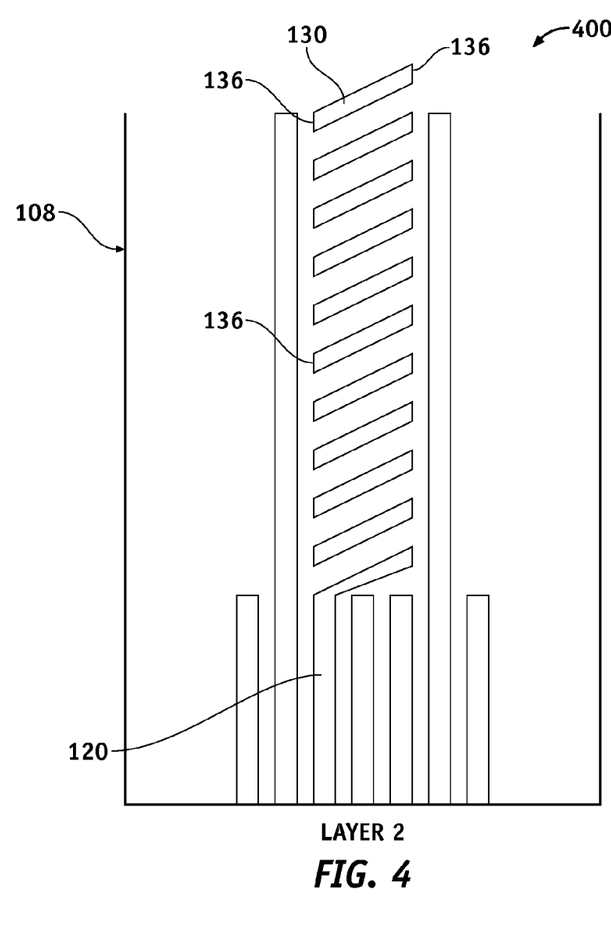

The second layer 108 is coupled to the first non-conductive layer 106. As shown in FIG. 4, the second layer 108 comprises the printed circuit patterned with a plurality of first diagonal conductor segments 130 comprising segment ends 136.

The non-conductive strip 110 (FIG. 5) is coupled to the second layer 108 such that the segment ends 136 (FIG. 6) of the first diagonal conductor segments 130 (FIG. 4) are exposed.

Figure 7:
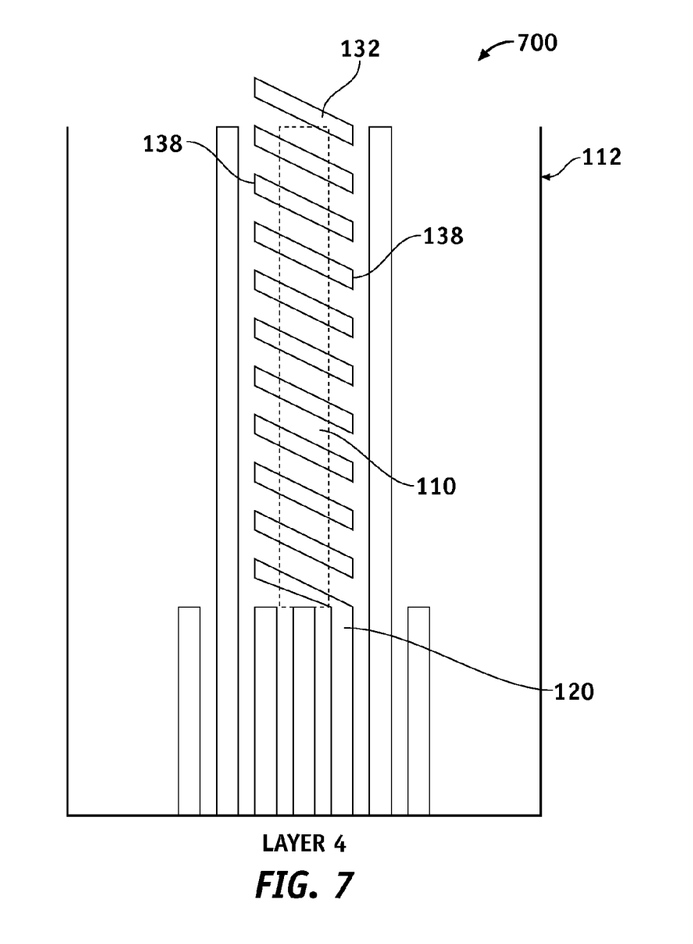
FIGS. 7-8 are illustrations of top views of a fourth layer, and a fifth layer respectively of an exemplary printed flexible multilayer twisted-pair shielded high speed data cable according to an embodiment of the disclosure.

The fourth layer 112 is coupled to the non-conductive strip 110. As shown in FIG. 7 the fourth layer 112 comprises a printed circuit patterned with a plurality of second diagonal conductor segments 132 comprising segment ends 138.

The first diagonal conductor segments 130 (FIG. 4) and the second diagonal conductor segments 132 (FIG. 7) are coupled at respective segment ends 136 and 138 such that at least two wires such as the data transmission wires 118 and 124 are formed around the non-conductive strip 110 thus providing the twisted-pair cable 100.

The second non-conductive layer 114 may be coupled to the fourth layer 112. The second non-conductive layer 114 may comprise, for example but without limitation, rubber, plastic, or other non-conductive to form a flexible substrate.

The second shielding layer 116 may be coupled to the second non-conductive layer 114. The second shielding layer 116 may comprise, for example but without limitation, a faraday cage, a patterned metal, or other electromagnetic shield, and patterned in a way to absorb incoming RF noise.

Various layers described in FIG. 2 are described in more detail in the context of discussion of FIGS. 3-14 below.

Figure 5:
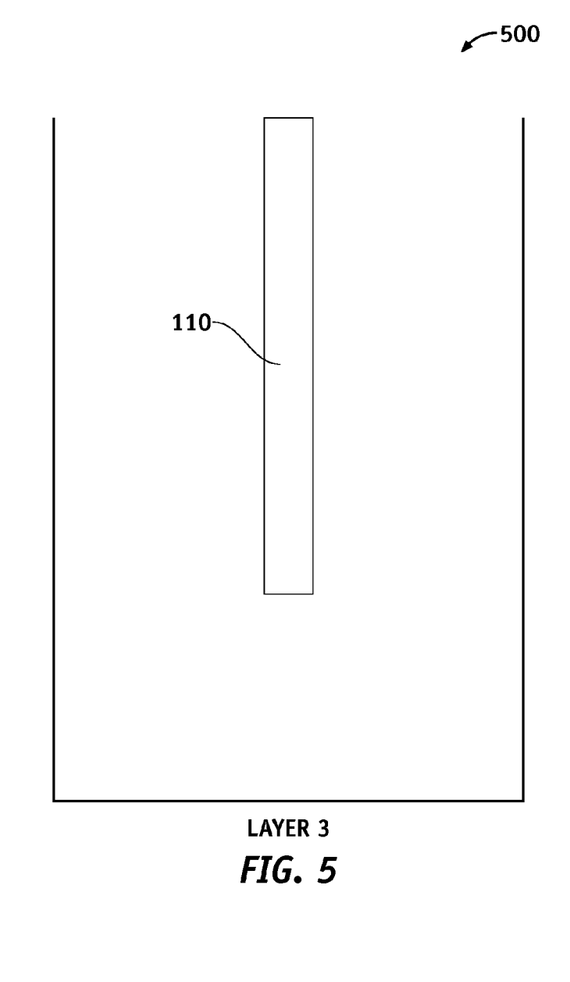

FIGS. 3-5 are illustrations of top views 300, 400, and 500 of a combined first shielding layer 104 and the first non-conductive layer 106 (FIG. 3); the second layer 108 (FIG. 4); and the non-conductive strip 110 (FIG. 5) respectively of the exemplary twisted-pair cable 100 (FIG. 1) according to an embodiment of the disclosure. As mentioned above, the second layer 108 comprises the printed circuit patterned with the first diagonal conductor segments 130 of the twisted-pair cable 100.

Figure 6:
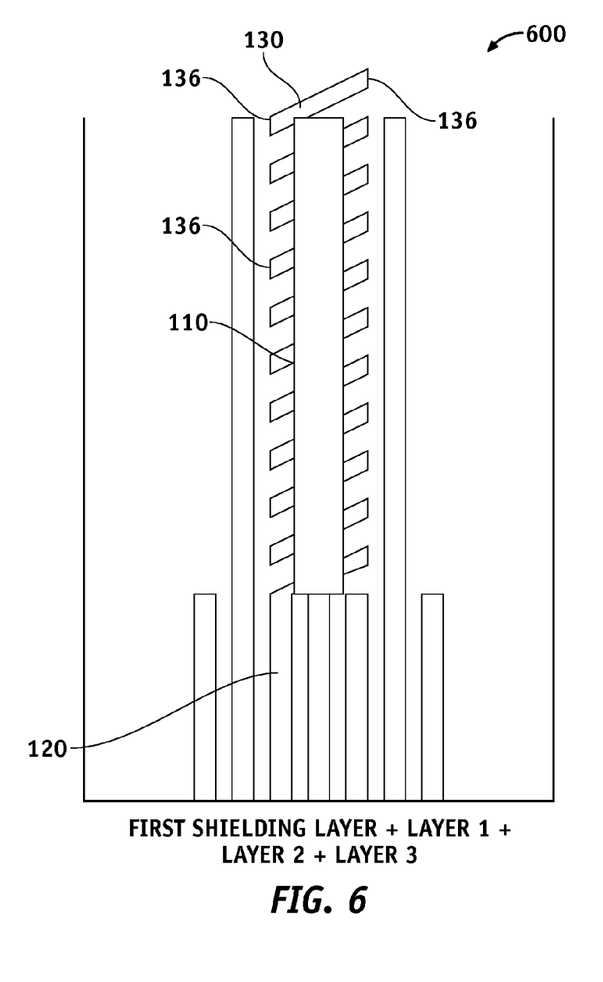
FIG. 6 is an illustration of a top view of various layers of an exemplary printed flexible multilayer twisted-pair shielded high speed data cable showing the first shielding layer and the first layer, the second layer, and the third layer of FIGS. 3-5 coupled according to an embodiment of the disclosure.

FIG. 6 is an illustration of a top view 600 of various layers of the exemplary twisted-pair cable 100 comprising the combined first shielding layer 104 and the first non-conductive layer 106, the second layer 108, and the non-conductive strip 110 of the FIGS. 3-5 coupled according to an embodiment of the disclosure. As mentioned above, the non-conductive strip 110 is coupled to the second layer 108 (FIG. 4) such that the segment ends 136 of the first diagonal conductor segments 130 are exposed.

Figure 8:
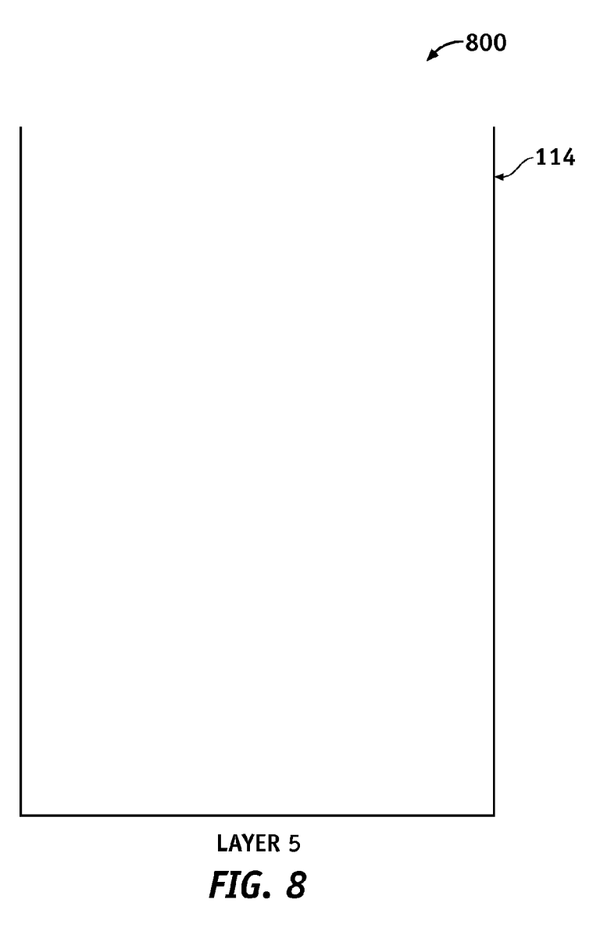

FIGS. 7-8 are illustrations of top views 700-800 of the fourth layer 112, and the second non-conductive layer 114 respectively of the exemplary twisted-pair cable 100 according to an embodiment of the disclosure. As mentioned above, the fourth layer 112 comprises the printed circuit patterned with the plurality of second diagonal conductor segments 132 with segment ends 138. The non-conductive strip 110 is coupled to the fourth layer 112 such that the segment ends 138 of the first diagonal conductor segments 132 are exposed. As mentioned above, the first diagonal conductor segments 130 (FIG. 4) and the second diagonal conductor segments 132 (FIG. 7) are coupled at respective segment ends 136 and 138 such that at least two wires such as the data transmission wires 118 and 124 (FIG. 1) are formed around the non-conductive strip 110 thus providing the twisted-pair cable 100 (FIG. 1). As shown in FIG. 8, the second non-conductive layer 114 is coupled to the fourth layer 112 to provide a protective non-conductive cover.

Figure 9:
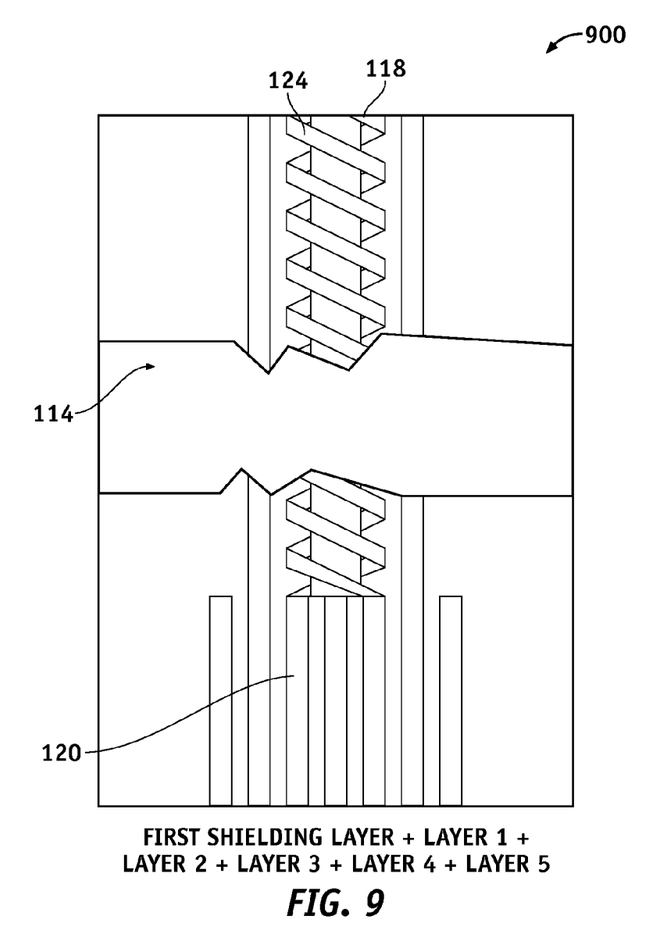
FIG. 9 is an illustration of a top view of various layers of an exemplary printed flexible multilayer twisted-pair shielded high speed data cable showing the layers shown in FIGS. 3-5 coupled to the fourth layer, and the fifth layer of the FIGS. 7-8 according to an embodiment of the disclosure.

FIG. 9 is an illustration of a top view 900 of various layers of the exemplary printed flexible multilayer twisted-pair shielded high speed data cable 100 comprising the layers shown in FIGS. 3-5 (that are combined in FIG. 6) coupled to the fourth layer 112, and the second non-conductive layer 114 of the FIGS. 7-8 according to an embodiment of the disclosure.

Figure 10:
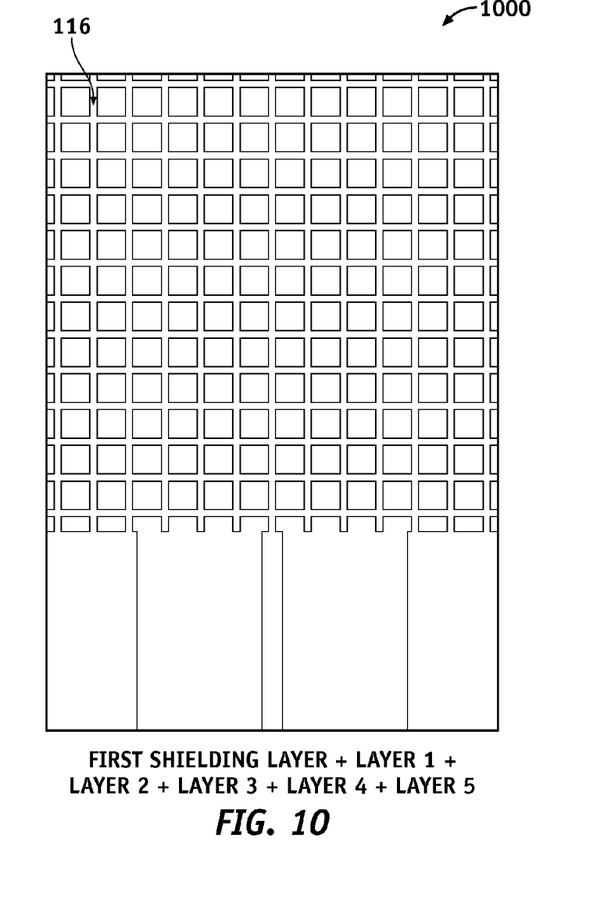
FIG. 10 is an illustration of a shielding layer of an exemplary printed flexible multilayer twisted-pair shielded high speed data cable according to an embodiment of the disclosure.

FIG. 10 is an illustration of a top view 1000 of a shielding layer such as the first shielding layer 104 and the second shielding layer 116 of the exemplary twisted-pair cable 100 according to an embodiment of the disclosure.

Figure 11:
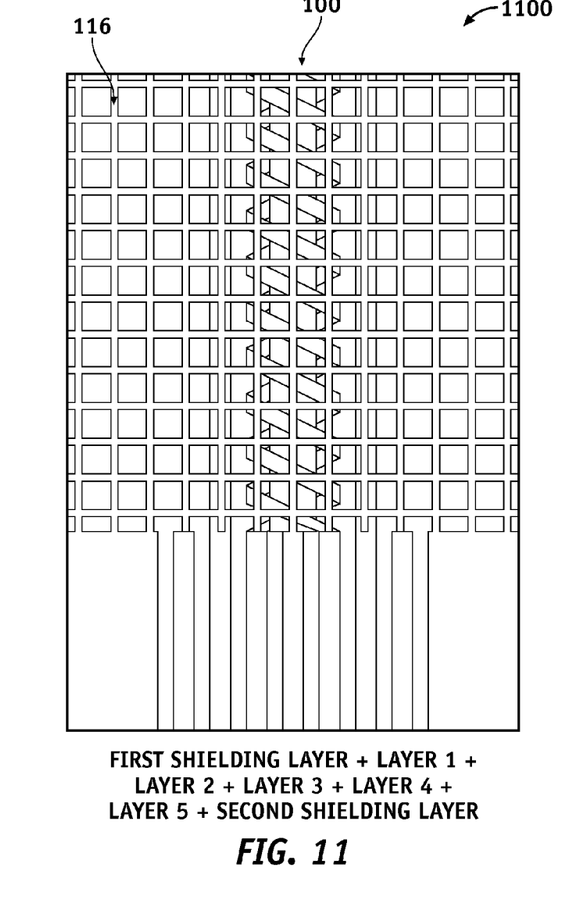
FIG. 11 is an illustration of various layers of an exemplary printed flexible multilayer twisted-pair shielded high speed data cable showing the layers shown in FIG. 9 coupled to a second shielding layer according to an embodiment of the disclosure.

FIG. 11 is an illustration of a top view of various layers of the exemplary printed flexible multilayer twisted-pair shielded high speed data cable 100 showing the layers shown in FIG. 9 coupled to the second shielding layer 116 according to an embodiment of the disclosure.

Figure 12:
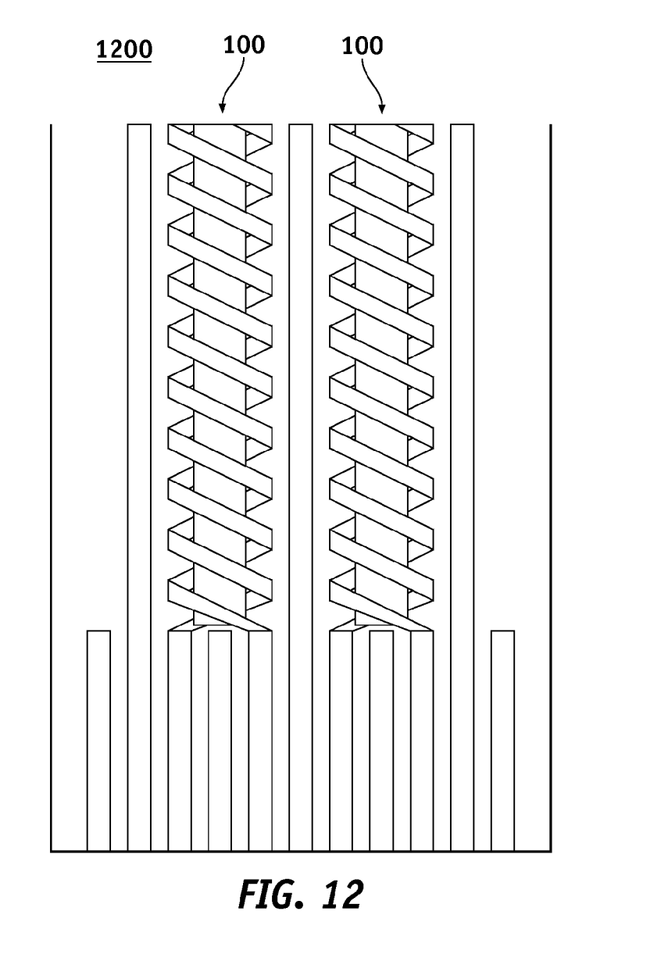
FIG. 12 is an illustration of a top view of an exemplary printed flexible multilayer twisted-pair shielded high speed data cable showing two twisted-pair wires according to an embodiment of the disclosure.

FIG. 12 is an illustration of a top view of an exemplary printed flexible multilayer twisted-pair shielded high speed data cable 1200 (twisted-pair cable 1200/printed twisted-pair cable 1200) showing two twisted-pair cables 100 according to an embodiment of the disclosure. The twisted-pair cable 1200 may comprises various numbers of twisted-pair cables 100 as desirable or appropriate for a given application or environment.

Figure 13:
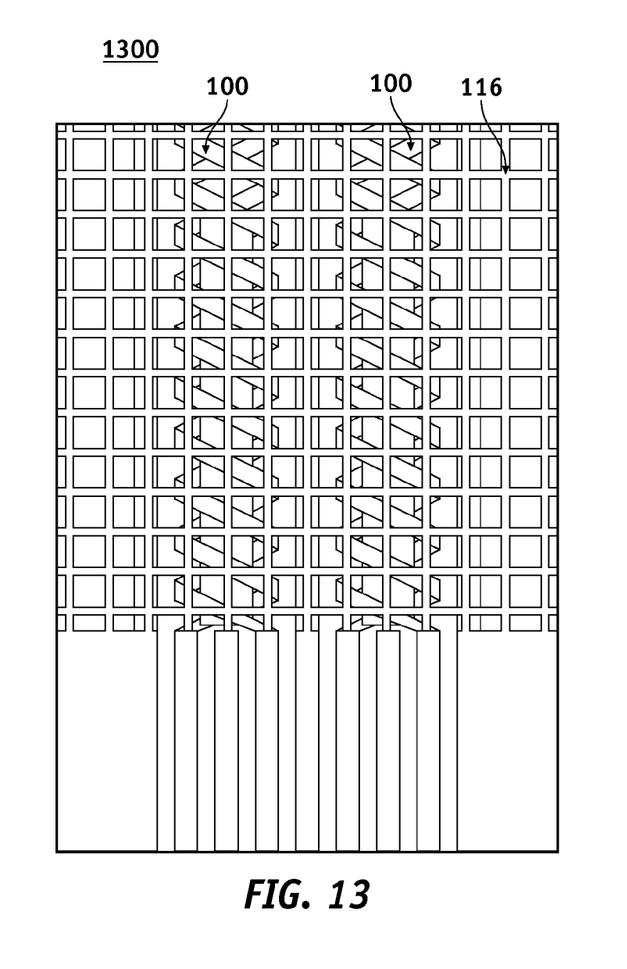
FIG. 13 is an illustration of the exemplary printed flexible multilayer twisted-pair shielded high speed data cable of FIG. 12 coupled to a second shielding layer according to an embodiment of the disclosure.

FIG. 13 is an illustration of a top view of the twisted-pair cable 1200 of FIG. 12 coupled to the second shielding layer 116 according to an embodiment of the disclosure.

Figure 14:
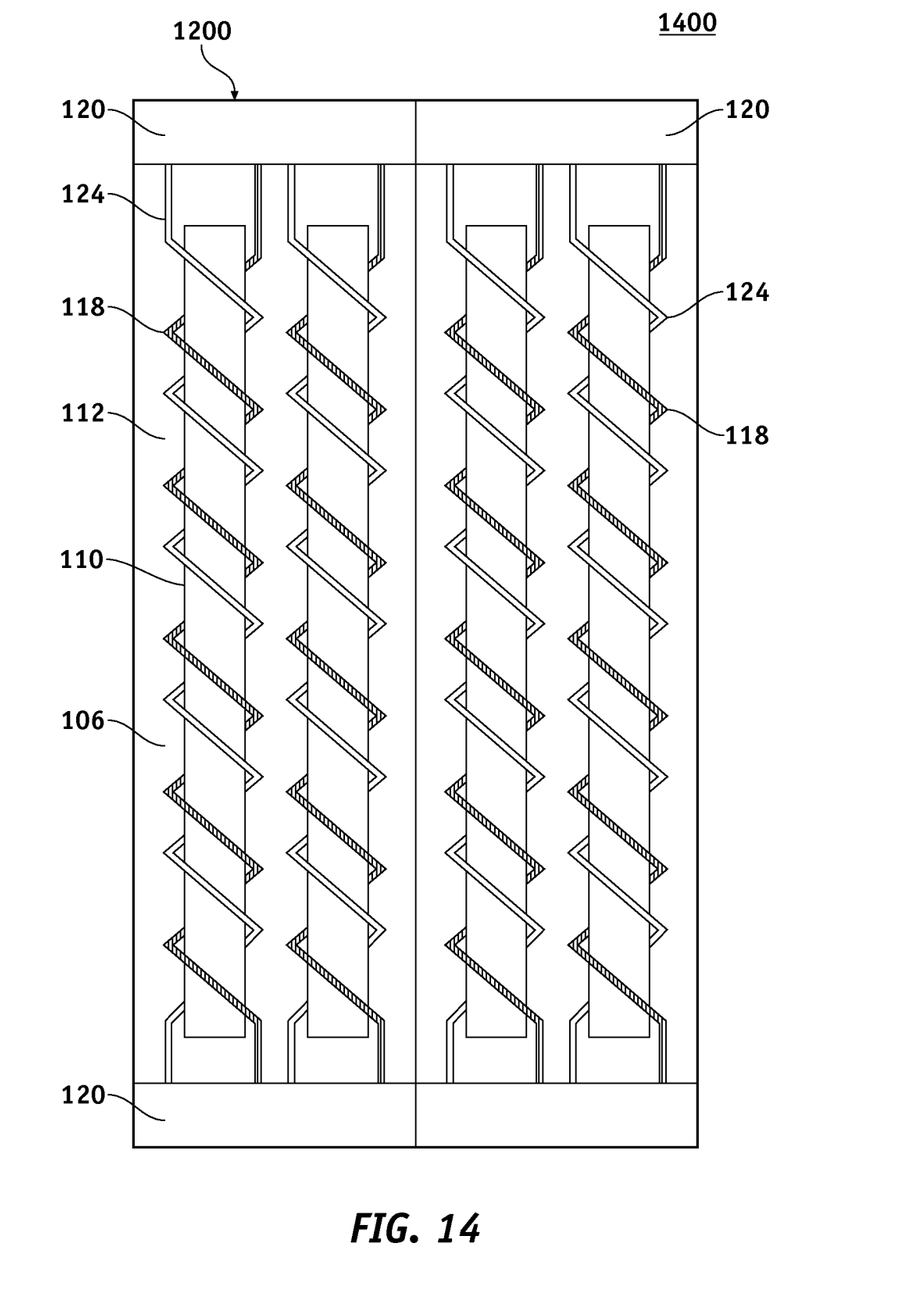
FIG. 14 is an illustration of a top view of an exemplary printed flexible multilayer twisted-pair shielded high speed data cable according to an embodiment of the disclosure.

FIG. 14 is an illustration of a top view 1400 of the exemplary twisted-pair cable 1200 according to an embodiment of the disclosure.

Figure 15:
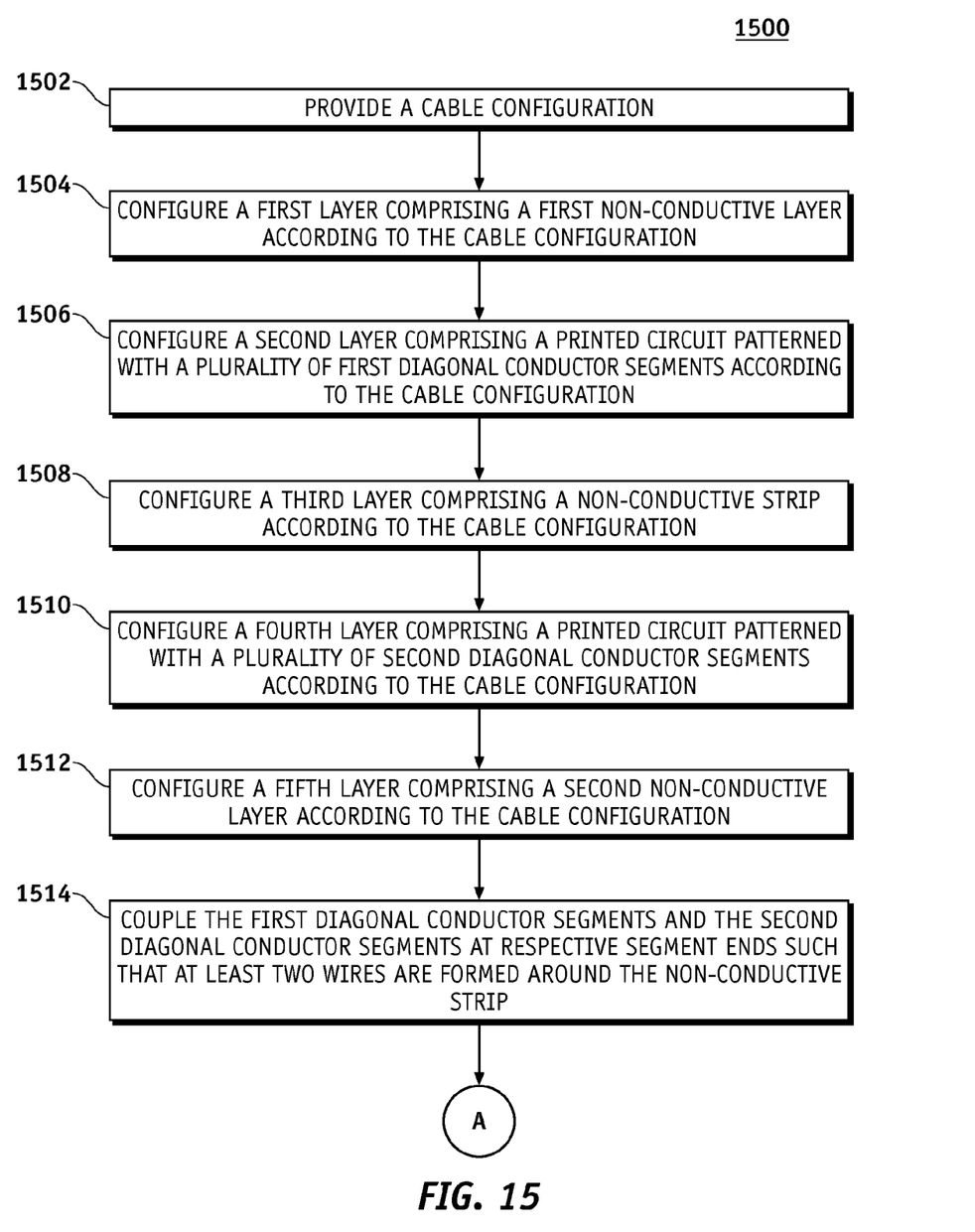
FIG. 15 is an illustration of an exemplary flowchart showing a process for customizing a twisted-pair cable according to an embodiment of the disclosure.

FIG. 15 is an illustration of an exemplary flowchart showing a process 1500 for customizing a twisted-pair cable such as the twisted-pair cable 100 according to an embodiment of the disclosure. The various tasks performed in connection with process 1500 may be performed mechanically, by software, hardware, firmware, a computer-readable medium having computer executable instructions for performing the process method, or any combination thereof. It should be appreciated that process 1500 may include any number of additional or alternative tasks, the tasks shown in FIG. 15 need not be performed in the illustrated order, and process 1500 may be incorporated into a more comprehensive procedure or process having additional functionality not described in detail herein.

For illustrative purposes, the following description of process 1500 may refer to elements mentioned above in connection with FIGS. 1-14. In practical embodiments, portions of the process 1500 may be formed by different layers of the printed flexible multilayer twisted-pair shielded high speed data cable 100 such as: the first shielding layer 104, the first non-conductive layer 106, the printed circuit patterned with a plurality of first diagonal conductor segments 130, the non-conductive strip 110, the printed circuit patterned with a plurality of second diagonal conductor segments 132, the second non-conductive layer 114, the second shielding layer 116, etc. Process 1500 may have functions, material, and structures that are similar to the embodiments shown in FIGS. 1-14. Therefore common features, functions, and elements may not be redundantly described here.

Process 1500 may begin by providing a cable configuration (task 1502). A cable configuration may comprise, for example but without limitation, lengths, dimensions, a cabling pattern, a signal type, an electrical load requirement, a shielding requirement, shielding dimensions, insulation thickness, or other cable properties.

Process 1500 may continue by configuring a first layer comprising a first non-conductive layer such as the first non-conductive layer 106 according to the cable configuration (task 1504).

Process 1500 may continue by configuring a second layer such as the second layer 108 comprising a printed circuit patterned with a plurality of first diagonal conductor segments such as the first diagonal conductor segments 130 according to the cable configuration (task 1506).

Process 1500 may continue by configuring a third layer comprising a non-conductive strip such as the non-conductive strip 110 according to the cable configuration (task 1508).

Process 1500 may continue by configuring a fourth layer such as the fourth layer 112 comprising a printed circuit patterned with a plurality of second diagonal conductor segments such as the second diagonal conductor segments 132 according to the cable configuration (task 1510).

Process 1500 may continue by configuring a fifth layer comprising a second non-conductive layer such as the second non-conductive layer 114 according to the cable configuration (task 1512).

Process 1500 may continue by coupling the first diagonal conductor segments 130 and the second diagonal conductor segments 132 at respective segment ends such as the respective segment ends 136 and 138 such that at least two wires such as the data transmission wires 118 and 124 are formed around the non-conductive strip 110 (task 1514).

Process 1500 may continue by coupling the first layer, the second layer, the third layer, the fourth layer, and the fifth layer to form the twisted-pair cable 100 (task 1516).

Process 1500 may continue by coupling a first shielding layer such as the first shielding layer 104 and a second shielding layer such as the second shielding layer 116 to the first layer and to the fifth layer respectively such that incoming electromagnetic noise is filtered out in a desired bandwidth thus minimizing an amount of metal needed for shielding (task 1518).

Process 1500 may continue by coupling a connector such as the connector 120 to each wire end such as wire end 126 and wire end 128 of the at least two wires such as the data transmission wires 118 and 124 respectively (task 1520). Thereby, a twisted-pair cable such as the twisted-pair cable 100 is provided.

Process 1500 may continue by applying a pressure sensitive adhesive backing to the first layer for attaching the first layer to a vehicle such as the vehicle 140 (task 1522).

Process 1500 may continue by installing the twisted-pair cable 100 on the vehicle 140 (task 1524).

Process 1500 may continue by powering electronic systems of the vehicle 140 through the twisted-pair cable 100 (task 1526).

Process 1500 may continue by transmitting electrical signals via the twisted-pair cable 100 (task 1528).

Process 1500 may continue by transmitting data via the twisted-pair cable 100 (task 1530).

Figure 16:
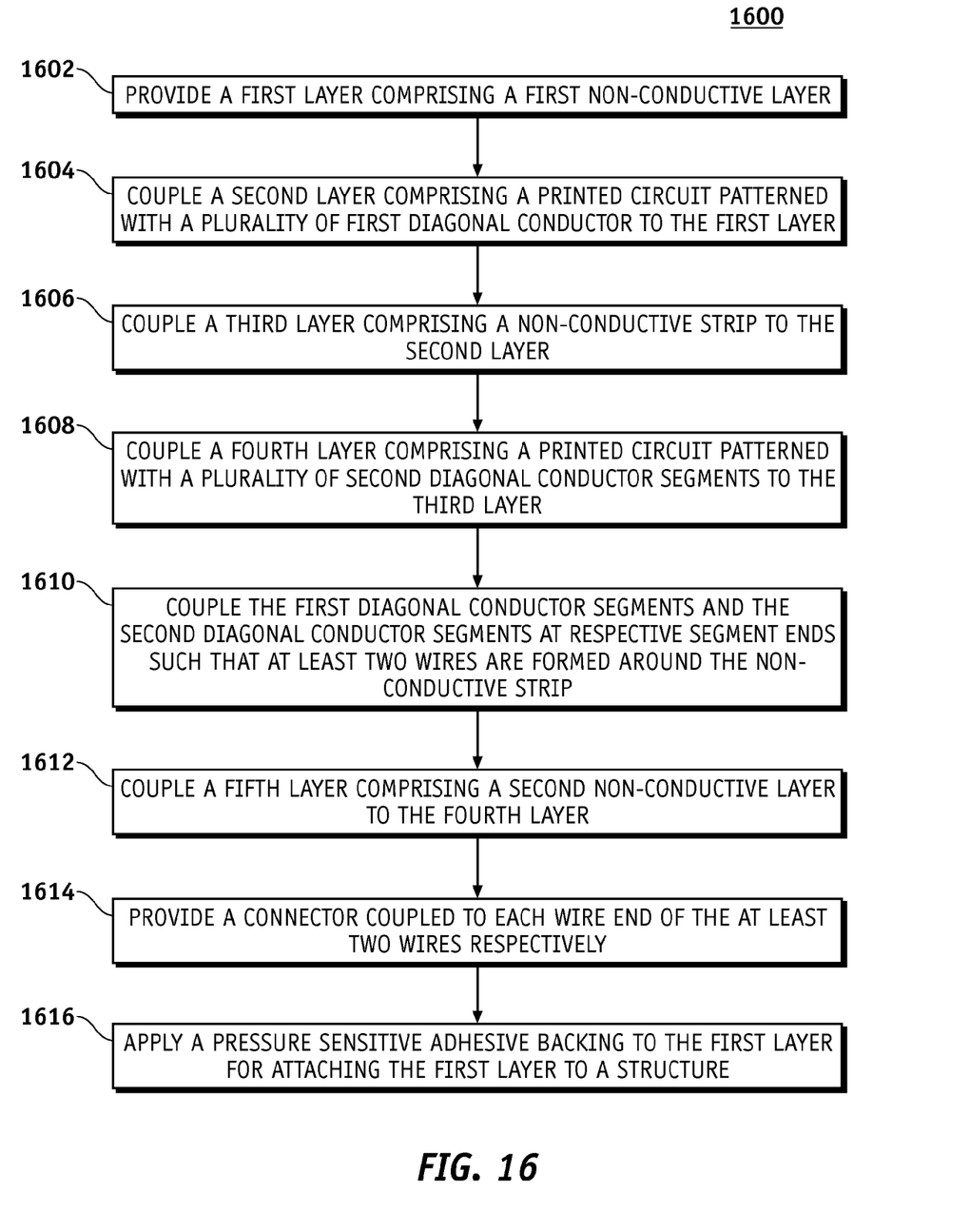
FIG. 16 is an illustration of an exemplary flowchart showing a process for providing a twisted-pair cable according to an embodiment of the disclosure

FIG. 16 is an illustration of an exemplary flowchart showing a process 1600 for providing a twisted-pair cable according to an embodiment of the disclosure. The various tasks performed in connection with process 1600 may be performed mechanically, by software, hardware, firmware, a computer-readable medium having computer executable instructions for performing the process method, or any combination thereof. It should be appreciated that process 1600 may include any number of additional or alternative tasks, the tasks shown in FIG. 16 need not be performed in the illustrated order, and process 1600 may be incorporated into a more comprehensive procedure or process having additional functionality not described in detail herein.

For illustrative purposes, the following description of process 1600 may refer to elements mentioned above in connection with FIGS. 1-14. In practical embodiments, portions of the process 1600 may be formed by different layers of the printed flexible multilayer twisted-pair shielded high speed data cable 100 such as: the first shielding layer 104, the first non-conductive layer 106, the printed circuit patterned with a plurality of first diagonal conductor segments 130, the non-conductive strip 110, the printed circuit patterned with a plurality of second diagonal conductor segments 132, the second non-conductive layer 114, the second shielding layer 116, etc. Process 1600 may have functions, material, and structures that are similar to the embodiments shown in FIGS. 1-14. Therefore common features, functions, and elements may not be redundantly described here.

Process 1600 may begin by providing a first layer comprising a first non-conductive layer such as the first non-conductive layer 106 (task 1602).

Process 1600 may continue by coupling a second layer such as the second layer 108 comprising a printed circuit patterned with a plurality of first diagonal conductor segments such as the first diagonal conductor segments 130 to the first layer (task 1604).

Process 1600 may continue by coupling a third layer comprising a non-conductive strip such as the non-conductive strip 110 to the second layer (task 1606).

Process 1600 may continue by coupling a fourth layer such as the fourth layer 112 comprising a printed circuit patterned with a plurality of second diagonal conductor segments such as the second diagonal conductor segments 132 to the third layer (task 1608).

Process 1600 may continue by coupling the first diagonal conductor segments 130 and the second diagonal conductor segments 132 at respective segment ends such as the respective segment ends 136 and 138 such that at least two wires such as the data transmission wires 118 and 124 are formed around the non-conductive strip 110 (task 1610).

Process 1600 may continue by coupling a fifth layer comprising a second non-conductive layer such as the second non-conductive layer 114 to the fourth layer (task 1612).

Process 1600 may continue by providing a connector such as the connector 120 coupled to each wire end such as wire end 126 and 128 of the at least two wires such as the data transmission wires 118 and 124 respectively (task 1614).

Process 1600 may continue by applying a pressure sensitive adhesive backing to the first layer for attaching the first layer to a structure (task 1616).

In this manner, the embodiments provide an automated method for providing the twisted-pair data cable such that the printed twisted-pair data transmission wires that cannot be misplaced or misconnected. A 'bundle' of the twisted-pair data transmission wires is very thin, and it can be routed through a vehicle with little structural impact. In addition, the printed twisted-pair data transmission wires are more flexible and are not as fatigue prone as standard wires. The printed twisted-pair data transmission wires open up the design space for wire integration, are not susceptible to issues associated with tradition flex cables such as cracking and fractured traces among other), and may have a longer fatigue life.

The above description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although FIGS. 1-14 depict example arrangements of elements, additional intervening elements, devices, features, or components may be present in an embodiment of the disclosure.

Terms and phrases used in this document, and variations thereof, unless otherwise expressly stated, should be construed as open segment ended as opposed to limiting. As examples of the foregoing: the term "including" should be read as meaning "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future.

Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

As used herein, unless expressly stated otherwise, "operable" means able to be used, fit or ready for use or service, usable for a specific purpose, and capable of performing a recited or desired function described herein. In relation to systems and devices, the term "operable" means the system and/or the device is fully functional and calibrated, comprises elements for, and meets applicable operability requirements to perform a recited function when activated. In relation to systems and circuits, the term "operable" means the system and/or the circuit is fully functional and calibrated, comprises logic for, and meets applicable operability requirements to perform a recited function when activated.

The invention claimed is:

1. A flexible printed twisted-pair cable comprising:
   a first layer comprising a first non-conductive layer;
   a second layer coupled to the first layer, and comprising a printed circuit patterned with a plurality of first diagonal conductor segments using printing materials;
   a third layer coupled to the second layer, and comprising a non-conductive strip;
   a fourth layer coupled to the third layer, and comprising a printed circuit patterned with a plurality of second diagonal conductor segments using printing materials, the first diagonal conductor segments and the second diagonal conductor segments coupled directly at respective segment ends such that at least two wires are printed around the non-conductive strip; and
   a fifth layer coupled to the fourth layer, and comprising a second non-conductive layer.

2. The twisted-pair cable of claim 1, further comprising a connector coupled to each wire end of the at least two wires respectively.

3. The twisted-pair cable of claim 1, wherein the first non-conductive layer and the second non-conductive layer each comprise a patterned conductive surface thereon comprising a geometry such that Radio Frequency (RF) energy is absorbed within a specific range.

4. The twisted-pair cable of claim 1, wherein the first non-conductive layer and the second non-conductive layer each comprise a flexible substrate.

5. The twisted-pair cable of claim 1, wherein a pressure sensitive adhesive backing is applied to the first layer for attaching the first layer to a structure.

6. A method for providing a flexible printed twisted-pair cable comprises:
   providing a first layer comprising a first non-conductive layer;
   printing a second layer comprising a printed circuit patterned with a plurality of first diagonal conductor segments on the first layer;
   coupling a third layer comprising a non-conductive strip to the second layer;
   printing a fourth layer comprising a printed circuit patterned with a plurality of second diagonal conductor segments on the third layer;
   coupling the first diagonal conductor segments and the second diagonal conductor segments directly at respective segment ends such that at least two wires are formed around the non-conductive strip; and coupling a fifth layer comprising a second non-conductive layer to the fourth layer.

7. The method of claim 6, further comprising providing a connector coupled to each segment end of the at least two wires respectively.

8. The method of claim 6, wherein the first non-conductive layer and the second non-conductive layer each comprise a patterned conductive surface thereon comprising a geometry such that Radio Frequency (RF) energy is absorbed within a specific range.

9. The method of claim 6, wherein the first non-conductive layer and the second non-conductive layer each comprise a flexible substrate.

10. The method of claim 6, further comprising applying a pressure sensitive adhesive backing to the first layer for attaching the first layer to a structure.

11. A method of customizing a flexible printed twisted-pair cable, the method comprising:

providing a cable configuration;

configuring a first layer comprising a first non-conductive layer according to the cable configuration;

configuring a second layer comprising a printed circuit patterned with a plurality of first diagonal conductor segments according to the cable configuration;

configuring a third layer comprising a non-conductive strip according to the cable configuration;

configuring a fourth layer comprising a printed circuit patterned with a plurality of second diagonal conductor segments according to the cable configuration;

configuring a fifth layer comprising a second non-conductive layer according to the cable configuration;

coupling the first diagonal conductor segments and the second diagonal conductor segments directly at respective segment ends such that at least two wires are formed around the non-conductive strip; and coupling the first layer, the second layer, the third layer, the fourth layer, and the fifth layer to form the twisted-pair cable.

12. The method of claim 11, further comprising coupling a first shielding layer and a second shielding layer to the first layer and to the fifth layer respectively such that incoming electromagnetic noise is filtered out in a desired bandwidth thus minimizing an amount of metal needed for shielding.

13. The method of claim 11, further comprising coupling a connector to each wire end of the at least two wires respectively.

14. The method of claim 11, further comprising applying a pressure sensitive adhesive backing to the first layer for attaching the first layer to a vehicle.

15. The method of claim 11, further comprising installing the twisted-pair cable on a vehicle.

16. The method of claim 15, further comprising powering electronic systems of the vehicle through the twisted-pair cable.

17. The method of claim 15, further comprising transmitting electrical signals via the twisted-pair cable.

18. The method of claim 15, further comprising transmitting data via the twisted-pair cable.

19. The method of claim 11, wherein the first non-conductive layer and the second non-conductive layer each comprise a flexible substrate.

20. The method of claim 11, further comprising printing the flexible printed twisted-pair cable using at least one printing material.

* * * * *